United States Patent [19]

Kawagai et al.

[11] 4,205,263
[45] May 27, 1980

[54] TEMPERATURE COMPENSATED CONSTANT CURRENT MOS FIELD EFFECTIVE TRANSISTOR CIRCUIT

[75] Inventors: Kenji Kawagai; Shigeki Yoshida, both of Kawasaki, Japan

[73] Assignee: Tokyo Shibaura Electric Co., Ltd., Japan

[21] Appl. No.: 821,198

[22] Filed: Aug. 2, 1977

[30] Foreign Application Priority Data

Aug. 3, 1976 [JP] Japan .................................. 51-92452

[51] Int. Cl.² .............................................. G05F 3/08
[52] U.S. Cl. ................................................. 323/22 R
[58] Field of Search ...................... 307/296, 297, 304; 323/1, 4, 8, 16, 22 R, 68

[56] References Cited

U.S. PATENT DOCUMENTS

| | | | |
|---|---|---|---|
| 3,710,271 | 1/1973 | Putman | 307/304 X |
| 3,806,742 | 4/1974 | Powell | 323/22 R |
| 3,934,159 | 1/1976 | Nomiya et al. | 307/304 |
| 4,009,401 | 2/1977 | Sasaki | 307/304 X |
| 4,015,146 | 3/1977 | Aihara et al. | 307/304 |
| 4,020,367 | 4/1977 | Yamashiro et al. | 323/4 X |
| 4,119,904 | 10/1978 | Haglund | 307/304 X |

*Primary Examiner*—A. D. Pellinen
*Attorney, Agent, or Firm*—Finnegan, Henderson, Farabow, Garrett & Dunner

[57] ABSTRACT

There is provided a MOS field effect transistor circuit comprising a negative power terminal, an N-channel type field effect transistor with the substrate coupled to the negative power terminal, a diode coupled in the forward direction between the negative power terminal and the gate of the N-channel type field effect transistor, and a high-resistance resistor coupled between the junction of the diode and the gate of the N-channel type field effect transistor and an earth terminal. The variation in the threshold voltage of the N-channel type field effect transistor owing to temperature change is compensated by variation in the forward voltage of diode with the temperature change to keep constant the voltage applied to the gate of the field effect transistor, thereby securing the constant current property of the field effect transistor for temperature change.

6 Claims, 7 Drawing Figures

TEMPERATURE COMPENSATED CONSTANT CURRENT MOS FIELD EFFECTIVE TRANSISTOR CIRCUIT

BACKGROUND OF THE INVENTION

This invention relates to a MOS field effect transistor circuit exhibiting constant current property irrespective of temperature change.

As large scale integrated circuits (LSI) have been increased in size and popularity, there have been increasing demands for incorporation of an analog-value detecting circuit for detecting a predetermined analog signal level a digital LSI. This analog-value detecting circuit may be used for notifying the user of e.g. wrong operation of the LSI due to fluctuation of a source voltage or heat generation of the LSI exceeding an allowable range. While this type of analog-value detecting circuit may operated as an analog circuit in a digital LSI, the analog circuit composed of circuit elements designed for digital LSI is not generally understood to facilitate analog operation with desired accuracy. Especially in LSI's employing MOS FET's, the operating temperature range is wide, and the current characteristic thereof will be substantially changed according to temperature change within such range. For example, though the circuit constant of an analog circuit may be so set as to enable it to detect current or voltage at a predetermined level, the analog circuit will detect a current or voltage at a level varied with temperature change. Thus, it has conventionally been deemed to be difficult to contruct by using MOS FET's a compact analog-value detecting circuit capable of detecting current or voltage at a predetermined level independently of temperature change within the aforesaid operating temperature range and to incorporate a detecting circuit of large size into a chip of LSI.

SUMMARY OF THE INVENTION

An object of this invention is to provide a MOS field effect transistor circuit exhibiting constant current property irrespective of temperature change.

According to an embodiment of the invention, there may be obtained a MOS field effect transistor circuit comprising a power terminal, a MOS field effect transistor, and a unidirectional circuit element coupled in the forward direction between the gate of the MOS field effect transistor and the power terminal.

DETAILED DESCRIPTION OF THE PREFERRED EMBODIMENTS

Figure 1:
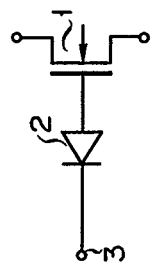
FIGS. 1 and 2 are circuit diagrams of a diode and MOS FET for illustrating the principle of this invention.
Figure 2:
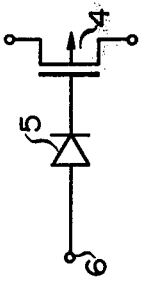

FIGS. 1 and 2 show the principle of the MOS FET circuit with constant-current property according to the invention. The circuit as shown in FIG. 1 has an N-channel type MOS FET 1 and a unidirectional circuit element or diode 2 coupled in the forward direction between the gate of the MOS FET 1 and a negative power terminal 3. The electric potential of the substrate of the MOS FET 1 is set at substantially the same or lower level as that of the negative power terminal 3. Meanwhile, the circuit as shown in FIG. 2 has a P-channel type MOS FET 4 and a diode 5 coupled in the forward direction between the gate of the MOS FET 4 and a positive power terminal 6. The potential of the substrate of the MOS FET 4 is set at substantially the same or higher level as that of the positive power terminal 6.

Figure 3:
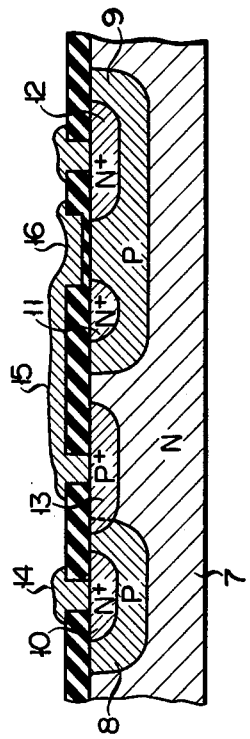
FIG. 3 is a sectional view of the semiconductor device corresponding to the circuit as shown in FIG. 1.

The circuit of FIG. 1, for example, may be so constructed as shown in FIG. 3. Referring now to FIG. 3, P-wells 8 and 9 are formed in the surface region of an N-conductivity type substrate 7. An N+-type region 10 is formed in the P-well 8, while N+-type regions 11 and 12 are formed in the P-well 9. Further, in the surface region of the substrate 7 is formed a P+-type region 13 partly overlying the P-well 8. The P-type region 8 and the N+-type region 10 form the diode 2, while the P-type region 9 and the N+-type regions 11 and 12 form the MOS FET 1. A metallic electrode 14 corresponds to the negative power terminal 3, and a metallic electrode 15 is coupled to the P-type region 8 through the P+-type region 13 at one end and to a gate electrode 16 at the other end.

Figure 4:
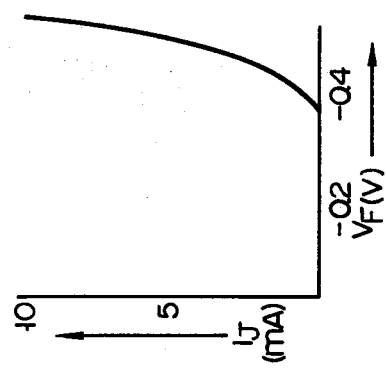
FIG. 4 is a graph showing the forward current characteristic of the diode.
Figure 6:
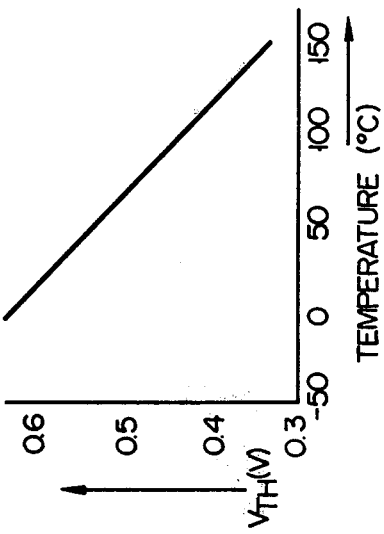
FIG. 6 is a graph showing the relationship between the threshold of the MOS FET and the temperature.
Figure 5:
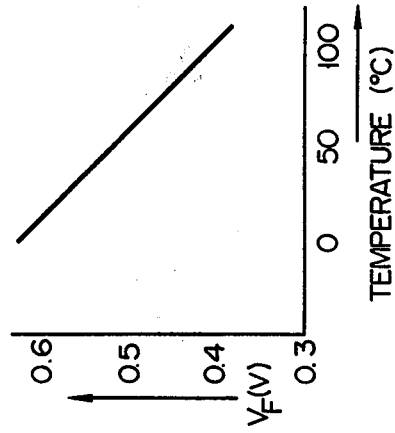
FIG. 5 is a graph showing the relationship between the forward voltage of the diode and the temperature.

As is clearly understood from FIG. 4 illustrating the forward-current property of the diode, a forward voltage higher than a predetermined forward voltage drop $V_F$ is required to obtain a forward current flow through such diode. In the circuit as shown in FIG. 1, for example, at the terminal of the diode 2 connected to the MOS FET 1 will appear a voltage higher than the voltage applied to the negative power terminal 3 by a level of the forward voltage drop $V_F$. Such forward voltage drop $V_F$ can be set by the impurity concentration of the P-type region 8 and N+-type region 10 in FIG. 3, and the ambient temperature. As shown in FIG. 5, the forward voltage drop $V_F$ and the temperature are in such relation that the former is reduced linearly as the latter increases. Further, as shown in FIG. 6, the relation between the threshold voltage $V_{TH}$ of the MOS FET and the temperature is such that former is reduced linearly as the latter increases. Accordingly, if the diode is connected in the forward direction between the power terminal and the gate of the MOS FET, the variation in the forward voltage drop of the diode owing to the temperature change will be compensated by the variation of the threshold voltage $V_{TH}$ in the MOS FET, thus allowing the MOS FET to lead a substantially constant current independently of the temperature change. That is, the difference $(V_G - V_{TH})$ between the threshold voltage $V_{TH}$ of the MOS FET and a gate voltage $V_G$ applied to the gate of the MOS FET through the diode in the forward direction is kept constant irrespective of the temperature change, thereby causing a constant current to flow between the drain and source of the MOS FET.

Since the forward voltage drop of the diode is small, the MOS field effect transistor circuit with preferable current property may be constructed by using a MOS FET with a low threshold voltage.

Figure 7:
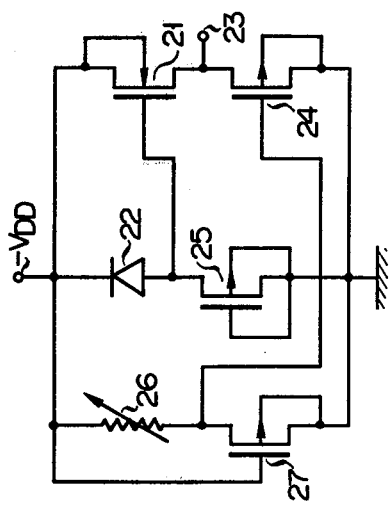
FIG. 7 is a circuit diagram illustrating the MOS field effect transistor circuit according to an embodiment of the invention.

FIG. 7 illustrates a preset-voltage detecting circuit constructed by using the circuit as shown in FIG. 1. This detecting circuit is provided with an N-channel type MOS FET 21 and a diode 22 coupled between the gate of the MOS FET 21 and a negative power source $-V_{DD}$. The drain of the MOS FET 21 is coupled to an output terminal 23 and grounded through a P-channel type MOS FET 24, while the source is coupled to the substrate of the MOS FET 21 and to the negative power source $-V_{DD}$. The anode of the diode 22 is grounded through a P-channel MOS FET 25 used as a high-resistance element. Between the negative power source $-V_{DD}$ and ground is coupled a series circuit including a variable resistance 26 and a P-channel type MOS FET 27. The source of the MOS FET 27 is coupled to the substrate, the drain is coupled to the gate of the MOS FET 24, and the gate is coupled to the negative power source $-V_{DD}$.

In this detecting circuit, a voltage divided by the variable resistance 26 and the MOS FET 27 is applied to the gate of the MOS FET 24, allowing the MOS FET 24 to be rendered conductive in an ordinary condition and keeping the output terminal 23 substantially at the ground potential. However, if the absolute value of the negative power source $-V_{DD}$ is reduced to a preset voltage level, the MOS FET 24 will be rendered non-conductive to make the potential at the output terminal 23 substantially equal to the negative power source $V_{DD}$, thereby securing properly the preset voltage. In this case, if the threshold voltage of the MOS FET 21 is varied, then the current flowing through the current path of such MOS FET will be substantially changed to prevent satisfactory detection of the preset voltage level. In this detecting circuit, however, the diode 22 is coupled in the forward direction between the negative power source $-V_{DD}$ and the gate of the MOS FET 21, so that a substantially constant current is introduced into the current path of the MOS FET 21 as described with reference to FIG. 1, thus securing highly reliable operation of the preset-voltage detecting circuit.

Although an illustrative embodiment of this invention has been described in detail herein, it is to be understood that the invention is not limited to this precise embodiment. For instance, as shown in FIG. 3, there is employed an enhancement-type MOS FET as the MOS FET 1 shown in FIG. 1, while it is of course possible to use a depletion-type MOS FET. Furthermore, though FIG. 7 shows the voltage detecting circuit including the N-channel type MOS FET 21 to which the circuit of FIG. 1 is employed, an equivalent voltage detecting circuit may also be constructed by using a P-channel type MOS FET, employing the circuit as shown in FIG. 2.

What we claim is:

1. A MOS field effect transistor circuit comprising a first and a second power terminal, a MOS field effect transistor, a unidirectional circuit element coupled in the forward direction between the gate of said MOS field effect transistor and said first power terminal, a high-resistance element coupled between the junction of said unidirectional circuit element and the gate of said MOS field effect transistor and said second power terminal; said MOS field effect transistor circuit further comprising a voltage-dividing circuit coupled between said first and second power terminals, and a switching element coupled between said MOS field effect transistor and said second power terminal, said switching element being controlled by a voltage divided by said voltage-dividing circuit.

2. A MOS field effect transistor circuit according to claim 1, wherein said switching element is a MOS field effect transistor whose gate is connected to receive the divided voltage from said voltage-dividing circuit, and whose substrate is coupled to said second power terminal.

3. A MOS field effect transistor circuit according to claim 1, wherein said high resistance element comprises an MOS field effect transistor.

4. A MOS field effect transistor circuit according to claim 1, wherein said voltage-dividing circuit includes first and second resistive means serially connected.

5. A MOS field effect transistor circuit according to claim 4, wherein said first resistive means is formed of a variable resistor and said second resistive means is formed of a field effect transistor.

6. A MOS field effect transistor circuit according to claim 1, wherein said voltage-dividing circuit is formed of a variable resistor and a field effect transistor connected serially to each other and said high resistance element is formed of a field effect transistor.

* * * * *